United States Patent [19]

Petty

[11] 4,082,159

[45] Apr. 4, 1978

[54] CERAMIC SPEAKER ENCLOSURE

[75] Inventor: Frank Petty, Paris, Tenn.

[73] Assignee: Mar-Kel Lighting, Inc., Paris, Tenn.

[21] Appl. No.: 689,154

[22] Filed: May 24, 1976

[51] Int. Cl.[2] ........................ H05K 5/00; G10K 13/00; A47B 81/06

[52] U.S. Cl. ........................ 181/156; 181/153; 181/171; 181/199

[58] Field of Search ................ 181/156, 199, 148–155, 181/171, 175

[56] References Cited

U.S. PATENT DOCUMENTS

| | | | |
|---|---|---|---|
| 2,065,751 | 12/1936 | Scheldorf | 181/151 |
| 2,890,297 | 6/1959 | Lehr | 181/148 |
| 3,023,830 | 3/1962 | Hammes | 181/148 |
| 3,746,125 | 7/1973 | Hammes | 181/199 |
| 3,750,838 | 8/1973 | Pyle, Jr. | 181/153 |

OTHER PUBLICATIONS

"Clean Sound from the Drainpipe 8", by David Weems, Pop. Electronics, vol. 16, No. 6, June 1962, pp. 59–62.

*Primary Examiner*—Stephen J. Tomsky
*Attorney, Agent, or Firm*—McNenny, Pearne, Gordon, Gail, Dickinson & Schiller

[57] ABSTRACT

A reflex type speaker enclosure integrally formed of ceramic material having a shell of hemispheroidal configuration and having an inturned speaker mounting flange adjacent the equatorial plane. The enclosure is adapted to be suspended by structure extending through an aperture in its apex. The flange forms a central, relatively large speaker aperture, and a plurality of circumferentially spaced, relatively small acoustic ports intermediate the shell and aperture. The radially inner edge of the flange is notched at the speaker aperture to permit placement of a speaker assembly into the interior of the hemispheroidal shell and allow insertion of suitable fasteners therethrough to secure the speaker assembly to the inwardly facing side of the flange portion.

3 Claims, 4 Drawing Figures

CERAMIC SPEAKER ENCLOSURE

BACKGROUND OF THE INVENTION

The invention relates to improvements in enclosures for speaker assemblies and, more particularly, relates to the reflex-type speaker enclosure.

PRIOR ART

Decorative speaker enclosures have, in the past, been produced in a large variety of configurations, materials, and constructions. The present invention considers an enclosure which employs a hemispheroidal configuration, ceramic material, and integral or single-piece construction. While these enumerated features have individually been previously employed, their full utilization in combination is not evident in the prior art.

SUMMARY OF THE INVENTION

The invention provides a unitary speaker enclosure of ceramic or like material having a primarily hemispheroidal configuration with an integral inturned flange adjacent the equatorial or sectional plane on which a conventional speaker assembly is mounted. A radially inward edge of the speaker mounting flange defines an aperture for the speaker diaphragm, while radially intermediate, circumferentially spaced regions of the flange are apertured to provide reflex ports for transmitting sound from the acoustic chamber formed within the hemispheroidal portion of the enclosure.

In a preferred embodiment, the inwardly facing side of the speaker mounting flange is adapted to be engaged by the speaker at its frontal plane as defined by its conventional clamp ring, so that the speaker may be supported in the ordinary and efficient manner for which it is designed. In order to permit placement of the speaker assembly into the hemispheroidal shell through the diaphragm aperture, the aperture is provided with at least one diametral clearance zone of a breadth greater than the major diameter of the speaker assembly. Limitation of the circumferential extent of this clearance zone to an area substantially less than the full circumference of the aperture assures that the clamp ring abuts, and thereby acoustically seals with, the associated rearwardly facing flange surface along a substantial portion of its peripheral extent. Further, in the illustrated embodiment, the diametral clearance zone is duplicated by providing sets of opposed notches in the flange edge arranged in quadrantal relation to provide four equally spaced points on this flange edge for reception of a corresponding number of fastening screws.

DESCRIPTION OF THE PREFERRED EMBODIMENT

Figure 1:
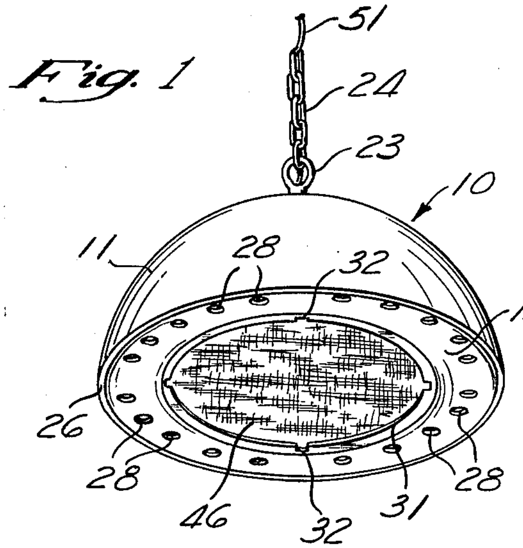
FIG. 1 is a perspective view, from below, of a suspended speaker enclosure constructed in accordance with the invention.

A speaker enclosure 10 constructed in accordance with the invention comprises an integrally formed hemispheroidal shell 11 and an inturned speaker mounting flange 12. The enclosure 10 is preferably molded or otherwise formed of ceramic or like hardenable, inorganic material of a nonmetallic base such as plaster or cement, and may have a decorative or porcelain-like coating, fired or otherwise, fixed on its outer surfaces, designated 14 and 15. The dome-like shell 11 is symmetrical about an imaginary central axis 16, and may be spherical or nearly spherical in vertical section. A relatively small aperture 17 is formed at the apex of the shell 11 for purposes of suspending the enclosure 10. An externally threaded nipple 21 of the type customarily used for hanging lamp fixtures is assembled through the aperture 17 and is retained on the shell 11 by a nut 22 and decorative loop 23. An ornamental chain 24 or other support medium is assembled on the loop 23 for suspending the enclosure 10.

A lower edge 26 of the enclosure shell lies in a plane transverse to the axis 16 at which the hemispheroid outline of the shell is sectioned from a full spheroid. The edge 26, as desired, may be above, below, or substantially at the equatorial plane of a hemispheroid outline. Stated in other words, as used herein and in the appended claims, the term "hemispheroid" is intended to include structures of spheroidal cross section, being somewhat more or less exactly one-half of a spheroid, as defined by a sectional plane transverse to an axis of symmetry.

The speaker mounting flange 12 adjacent the sectional or equatorial plane of the lower shell edge 26 extends radially inwardly from the shell and forms a lower end face of the enclosure 10. A plurality of acoustic ports or apertures 28 are circumferentially spaced in the flange 12 at a generally constant diameter from the central axis 16. An inner peripheral edge 29 of the flange 12 outlines a generally circular speaker diaphragm aperture 31. The circular shape of the aperture 31 is interrupted by a set of four notches 32 arranged on the aperture in quadrantal relation to one another. A rear surface of the flange 12 includes an annular, generally planar lip or seating surface 33.

A speaker assembly 36 disposed within a chamber 37 substantially enclosed by the shell 11 and the flange 12 is generally conventional in construction. The speaker assembly 36 includes a magnet case 39 supported on a truncated, conical diaphragm housing 40. In a customary manner, the moving coil (not shown) associated with the magnet case 39 drives a diaphragm 41 within the housing 40 to reproduce sound by means of electrical energy supplied to the coil. A clamp or sealing ring 43 is disposed within a peripheral, axially extending rim 44 of the diaphragm housing 40. The clamp ring 43 is formed of somewhat resilient material to permit it to form an acoustic seal against the surfaces which it contacts.

Where desired, a sound-transmitting perforate web 46 of fabric or like material, cut in a circular pattern of a diameter approximately equal to the diameter of the diaphragm housing 40 may be interposed between the speaker assembly 36 and flange 12 for purposes of appearance whereby the speaker assembly 36 is concealed from external view. The speaker assembly 36 is secured to the flange 12 by a plurality of fastening screws 47, which draw the clamp ring 43 into sealing engagement with the fabric 46 and the latter, in turn, in acoustic sealing engagement with the flange lip or seating surface 33. It will be understood that where the fabric 46 is omitted, the clamp ring 43 is adapted to directly engage or seat on the lip 33. As shown, the lip 33 is arranged to underlie a substantial area of the clamp ring 43 and present a support surface which is parallel to the plane of the clamp ring to thereby afford effective acoustic sealing between these elements directly or between a planar element such as the fabric 46 interposed therebetween. In this connection, it is pointed out that the annular planar lip surface 33 is interrupted circumferentially by the notches 32 only to a very limited extent so that the clamp ring 43 is supported and acoustically sealed thereby substantially along its full circumference.

A wire set 51 is intertwined with the chain 24 and passes through the loop 23 and nipple 21 to provide the electrical signal to the speaker assembly 36. A transformer 52 is conveniently mounted on the diaphragm housing 40 to reduce the voltage of the signal at the wire set 51 to suitably match the impedance of the speaker coil.

The enclosure 10 forms a generally rigid structure which acoustically neither appreciably vibrates nor absorbs sound and, in the recognized manner of a reflex enclosure, controls interraction between the sound radiation from the front of the speaker diaphragm, i.e., facing the aperture 31, and from the rear of the diaphragm, i.e., facing the chamber 37. Sound radiation from the rear of the diaphragm 41, as understood by those skilled in the art, may be shifted in phase, modified in amplitude, and combined with the front radiation by passage through the ports 28 to improve speaker performance.

Figure 2:
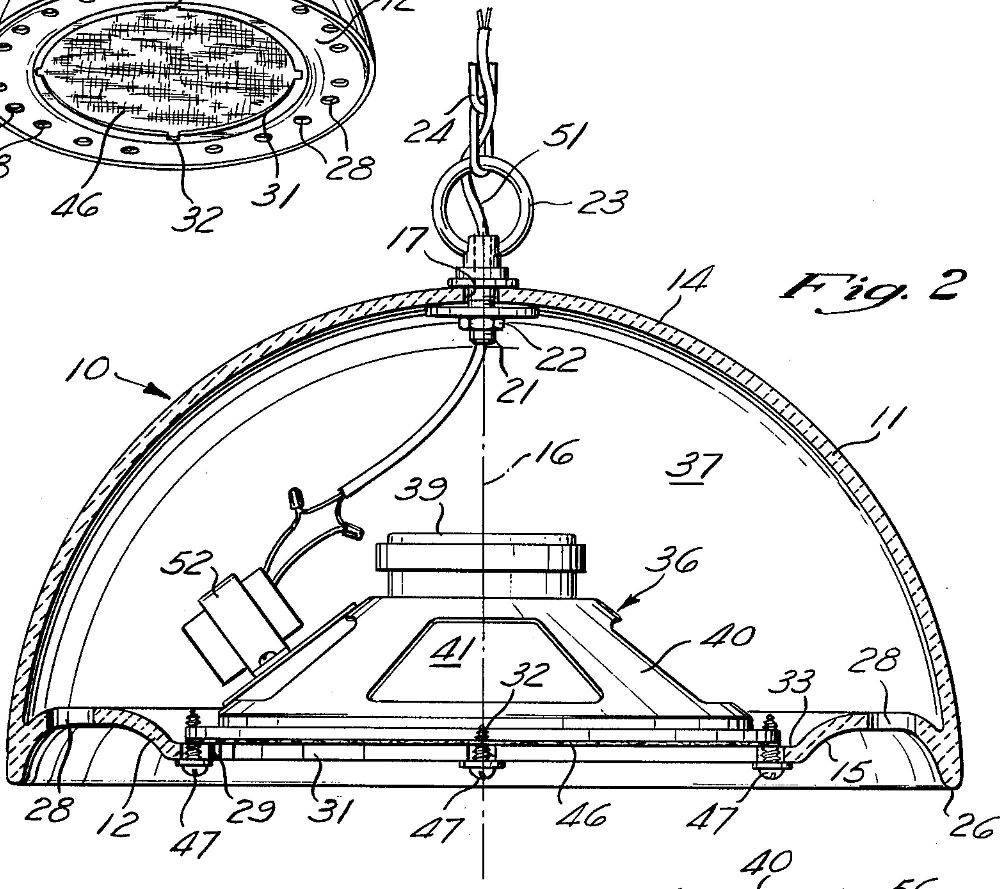
FIG. 2 is a cross sectional view of the suspended speaker enclosure taken through a vertical plane and revealing a speaker assembly mounted therein.
Figure 2A:
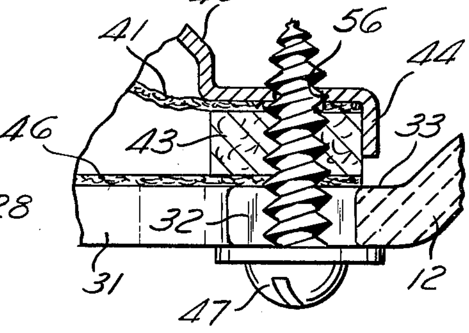
FIG. 2*a* is a fragmentary, cross sectional view on an enlarged scale, showing mounting details of the speaker assembly on the enclosure.
Figure 3:
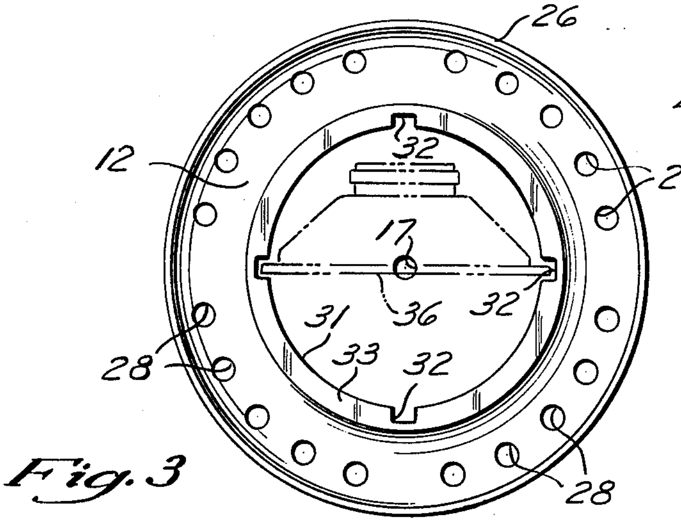
FIG. 3 is a view of a lower flanged face of the enclosure at its equatorial or sectional plane.

In accordance with an important aspect of the invention, the notches 32 associated with the flange edge 31 are provided in diametrally opposed pairs to provide a diametral clearance at least as large as the major diameter of the speaker assembly 36 as defined by the peripheral speaker housing flange 44. As suggested in FIG. 3, this diametral clearance afforded by the notches 32 permits the speaker assembly 36 to be inserted into the enclosure 37 by passage of the speaker periphery through a pair of diametrally opposed notches. Where, as shown in FIG. 3, the notches 32 are arranged in quadrantal relation, the notches, in addition to permitting insertion of the speaker assembly 36 into the enclosure, also provide points for passage of the mounting screws 47 through the plane of the flange 12. This quadrantal relation is particularly advantageous, since most commercially available speaker assemblies are provided with preformed fastening holes 56 (FIG. 2*a*), also in quadrantal relation, in their peripheries to accept the fastening screws 47. The notches 32 ideally are made sufficiently large, both radially and circumferentially, to accommodate anticipated variations in the actual location of the mounting holes in the speaker housing 40.

While the invention has been described in connection with specific embodiments thereof, it is to be clearly understood that this is done only by way of example, and not as a limitation to the scope of the invention as set forth in the objects thereof and in the appended claims.

What is claimed is:

1. The combination comprising a speaker assembly integrally formed of ceramic material, the enclosure including a hemispheroidal shell portion and an integral flange portion, said shell portion being generally symmetrical with respect to a central axis and having an aperture at its apex, a threaded nipple element extending through said aperture, a decorative loop on the exterior of said shell portion and connected to said nipple element, a nut within said shell portion threaded onto said nipple element and retaining said nipple element and said loop on said shell portion whereby said enclosure is adapted to be suspended by said loop, nipple element, and nut, said nipple element being adapted to allow an electrical wire set to be assembled through said aperture, said flange portion extending radially inward from said shell portion at a plane adjacent an equatorial plane of said hemispheroidal shell portion, a radially inward edge of said flange portion defining a generally circular speaker aperture concentric with said axis of symmetry, a side of said flange portion facing inwardly towards the interior of said shell portion providing a planar seating surface extending substantially along the full circumferential extent of said speaker aperture, a set of notches in said speaker aperture and interrupting said planar seating surface, a plurality of acoustic ports relatively small in comparison to the diameter of said speaker aperture circumferentially spaced about said flange portion, a speaker assembly within said hemispheroidal shell portion, said speaker assembly having a peripheral rim and including a clamp ring having a diameter greater than the diameter of said aperture and being disposed over said seating surface, said flange notches being dimensioned to permit said speaker assembly to be inserted therethrough into the interior of said shell portion, a plurality of fasteners extending through said notches and said clamp ring and engaging an area of the speaker assembly adjacent the rim to draw said clamp ring and speaker assembly axially towards said seating surface to form an acoustic seal therebetween.

2. In combination, an enclosure for a speaker assembly comprising an integrally formed body of ceramic material, including a hemispheroidal shell portion and an annular, generally radial wall portion extending inwardly from said hemispheroidal portion generally parallel and adjacent an equatorial plane of the hemispheroid, said radial wall portion having a plurality of relatively small acoustic ports spaced along its circumferential extent, said wall portion defining at its radially innermost extent a relatively large speaker aperture, said wall portion including a generally planar support seat extending generally parallel to the equatorial plane of the hemispheroid, a speaker assembly within the hemispheroidal portion, said speaker assembly having a generally circular mounting rim defining a major diameter of the speaker assembly, said support seat being annular and facing inwardly towards the interior of the hemispheroidal shell portion, said support seat extending circumferentially along a major portion of said aperture and having a minimum diameter less than the major diameter of the speaker assembly, said wall having at said aperture diametrically opposed clearance zones with a spacing greater than the major diameter of said speaker assembly whereby said speaker assembly may be inserted through said wall portion into the interior of said hemispheroidal shell portion, said speaker being fastened to and supported by said wall portion.

3. The combination as set forth in claim 2, wherein said clearance zones are formed of a set of notches in quadrantal relation, said speaker assembly being secured to said speaker supporting surface by fastening means extending through said notches.

* * * * *